United States Patent
Lewis et al.

(10) Patent No.: US 7,625,596 B2
(45) Date of Patent: Dec. 1, 2009

(54) ADHESION PROMOTER, ELECTROACTIVE LAYER AND ELECTROACTIVE DEVICE COMPRISING SAME, AND METHOD

(75) Inventors: Larry Neil Lewis, Scotia, NY (US); Venkatesan Manivannan, Rexford, NY (US); Tami Janene Faircloth, Niskayuna, NY (US); Jie Liu, Niskayuna, NY (US); James Anthony Cella, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 796 days.

(21) Appl. No.: 11/013,165

(22) Filed: Dec. 15, 2004

(65) Prior Publication Data

US 2006/0127562 A1    Jun. 15, 2006

(51) Int. Cl.
 *B05D 5/06* (2006.01)
 *C09K 11/00* (2006.01)
(52) U.S. Cl. .......................... 427/66; 156/67; 156/310; 313/504; 428/917; 445/23; 445/24
(58) Field of Classification Search ............. 427/66; 445/23–24; 428/917; 313/504; 156/60, 156/67, 310
See application file for complete search history.

(56) References Cited

U.S. PATENT DOCUMENTS 4,374,760 A    2/1983  Charles (Continued)

FOREIGN PATENT DOCUMENTS

EP    0 913 444    5/1999

(Continued)

OTHER PUBLICATIONS

Tzung-Fang Guo et al, "High Performance Polymer Light-Emitting Diodes Fabricated by a Low Temperature Lamination Process", Advanced Functional Materials, vol. 11, No. 5, pp. 339-343, XP-001083338, Oct. 2001.

(Continued)

*Primary Examiner*—Timothy H Meeks
*Assistant Examiner*—Jimmy Lin
(74) *Attorney, Agent, or Firm*—Mary Louise Gioeni

(57) ABSTRACT

In one embodiment the present invention discloses a method for making a first layer in an electroactive device comprising the steps of (i) preparing a composition by mixing at least one adhesion promoter material and at least one electroactive material; and (ii) depositing said composition onto a second electroactive layer of said electroactive device; and (iii) optionally further depositing a third electroactive layer onto the surface of said first layer opposite the second layer, wherein said composition enables adhesion between said first layer and said second layer or between said first layer and said third layer, or between said first layer and both said second layer and said third layer. In another embodiment the present invention discloses a method for improving adhesion between layers in an electroactive device comprising the steps of (i) depositing a surface treatment composition comprising at least one adhesion promoter material on at least one surface of a first electroactive layer, and (ii) depositing a second electroactive layer onto the surface of said first layer comprising said adhesion promoter; wherein said composition enables adhesion between said first layer and said second layer of said electroactive device. Electroactive layers and electroactive devices comprising said layers are also disclosed, as well as methods to make said electroactive devices. In another embodiment adhesion promoters comprising 9,9-disubstituted fluorenyl compounds are disclosed, as well as methods for making the same.

12 Claims, 4 Drawing Sheets

U.S. PATENT DOCUMENTS

| | | | | |
|---|---|---|---|---|
| 4,898,784 | A * | 2/1990 | Sanders et al. | 428/412 |
| 5,503,910 | A * | 4/1996 | Matsuura et al. | 428/212 |
| 5,516,577 | A * | 5/1996 | Matsuura et al. | 428/212 |
| 5,837,391 | A * | 11/1998 | Utsugi | 428/690 |
| 5,932,363 | A * | 8/1999 | Hu et al. | 428/690 |
| 5,965,979 | A * | 10/1999 | Friend et al. | 313/504 |
| 6,248,458 | B1 * | 6/2001 | Yoon et al. | 428/690 |
| 6,258,954 | B1 * | 7/2001 | Kunimoto et al. | 546/36 |
| 6,403,236 | B1 * | 6/2002 | Ohnishi et al. | 428/690 |
| 6,525,466 | B1 * | 2/2003 | Jabbour et al. | 313/504 |
| 6,596,569 | B1 | 7/2003 | Bao et al. | |
| 6,794,061 | B2 | 9/2004 | Liao et al. | |
| 2001/0021452 | A1 * | 9/2001 | Kishioka et al. | 428/343 |
| 2002/0128351 | A1 * | 9/2002 | Kiguchi et al. | 523/161 |
| 2002/0132911 | A1 * | 9/2002 | Rietz et al. | 524/577 |
| 2003/0022409 | A1 | 1/2003 | Epstein et al. | |
| 2003/0049560 | A1 | 3/2003 | Nirmal et al. | |
| 2003/0152801 | A1 * | 8/2003 | Liao et al. | 428/690 |
| 2004/0115341 | A1 | 6/2004 | Rantala et al. | |
| 2005/0008893 | A1 * | 1/2005 | Kato | 428/690 |

FOREIGN PATENT DOCUMENTS

WO     WO 03-011939 A1 *    2/2003

OTHER PUBLICATIONS

Partial European Search Report dated Mar. 2, 2006.
U.S. Appl. No. 10/761,696, filed Jan. 22, 2004 entitled, "Charge Transfer-Promoting Materials and Electronic Devices Incorporating Same".
George Pilcher, Journal of Coatings Technology, "*Study of Organic Titanates As Adhesion Promoters*", vol. 51, No. 655, pp. 38-43.

* cited by examiner

ADHESION PROMOTER, ELECTROACTIVE LAYER AND ELECTROACTIVE DEVICE COMPRISING SAME, AND METHOD

STATEMENT REGARDING FEDERALLY SPONSORED RESEARCH & DEVELOPMENT

This invention was made with Government support under contract number 70NANB3H3030 awarded by NIST. The Government has certain rights in the invention.

BACKGROUND OF THE INVENTION

The invention relates generally to adhesion promoters, electroactive devices comprising the same, and methods. In one embodiment the invention relates particularly to adhesion promoters between layers in a multilayered electroactive device comprising at least one electroactive organic layer.

Many electroactive devices including opto-electronic devices, organic light emitting devices, electroluminescent devices, photovoltaics, and organic thin film transistors have two or more layers of organic or inorganic materials, or a combination of such layers. Desirably the performance of these devices can be enhanced by improving the mechanical stability of these layers. Improved adhesion between layers may help improve the mechanical stability while reducing the interfacial electrical resistance. A particularly difficult problem is the adhesion between inorganic and organic layers in such devices. For example, adhesion of a titanium dioxide layer to a plastic layer or of a light emitting polymer layer to a cathode metal layer often presents problems.

Most of the state-of-the-art organic light emitting devices (OLED) are composed of multilayers. An illustrative multilayer OLED may be represented as: ITO//HTL//LEP//Cathode where ITO is an anode comprising indium tin oxide, HTL is a hole-transporting layer, LEP is a light emitting polymer and the cathode may be one of a low work function metal such as, but not limited to, Al or Ca. Layers can be deposited via vapor methods or from solution by spin coating, dip coating, and like methods. An illustrative photovoltaic device (PV) employs a dye-coated metal oxide like titanium dioxide to absorb light and separate charges from the dye excited state. For example, $TiO_2$ may be deposited on a conducting metal oxide like ITO. Device performance for these and other electroactive devices depends on formation of intimate contacts between the layers and the capability of maintaining the intimate contacts, which is particularly critical for flexible substrates and devices. It would therefore be desirable to find methods and device structures that have, among other properties, improved adhesion between layers in a multilayered device. It would also be desirable to identify efficient adhesion promoters to provide said adhesion.

BRIEF DESCRIPTION OF THE INVENTION

Briefly, one aspect of the present invention is a method for making a first layer in an electroactive device comprising the steps of (i) preparing a first layer composition by mixing at least one adhesion promoter material and at least one electroactive material; and (ii) depositing said composition on a second electroactive layer of said electroactive device to form said first layer; and (iii) optionally further depositing a third layer of electroactive material onto the surface of said first layer opposite the second layer, wherein said first layer composition enables adhesion between said first layer and said second layer or between said first layer and said third layer, or between said first layer and both said second layer and said third layer.

Another aspect of the present invention is a method for making a first layer in an electroactive device comprising the steps of (a) preparing a first layer composition by mixing at least one adhesion promoter material and at least one electroactive material, wherein the adhesion promoter material comprises at least one compound selected from the group consisting of mixtures of titanium tetraalkoxide with tetraalkyl orthosilicate, mixtures of titanium tetrabutoxide with tetraethylorthosilicate; 9,9-disubstituted fluorenyl compounds, alpha-(1-naphthyl)-omega-trialkoxysilyl alkanes, copolymers of styrene with vinyl naphthalene, methacryloxyalkyl trialkoxysilanes, methacryloxypropyltrimethoxysilanes, glycidoxyalkyl trialkoxysilanes, glycidoxypropyl trimethoxysilane, and combinations thereof; and (b) depositing said composition on a second electroactive layer of said electroactive device to form said first layer, and optionally further depositing a third electroactive layer onto the surface of said first layer opposite the second layer, wherein said first layer composition enables adhesion between said first layer and said second layer or between said first layer and said third layer, or between said first layer and both said second layer and said third layer.

Another aspect of the present invention is an electroactive layer comprising an intimate mixture of at least one adhesion promoter material and one electroactive organic material.

Another aspect of the present invention is an electroactive device comprising a layer comprising an intimate mixture of at least one adhesion promoter material and one electroactive organic material.

Another aspect of the present invention is a method for improving adhesion between layers in an electroactive device comprising the steps of (i) depositing a surface treatment composition comprising at least one adhesion promoter material on at least one surface of a first electroactive layer, and (ii) depositing a second electroactive layer onto the surface of said surface treatment composition comprising said adhesion promoter; wherein said composition enables adhesion between said first layer and said second layer of said electroactive device.

Another aspect of the present invention is a method for improving adhesion between layers in an electroactive device comprising the steps of (i) depositing a surface treatment composition comprising at least one adhesion promoter material on at least one surface of an electroactive layer; and (ii) depositing a second electroactive layer onto the surface of said surface treatment composition comprising said adhesion promoter; wherein the adhesion promoter material comprises at least one compound selected from the group consisting of mixtures of titanium tetraalkoxides with tetraalkylorthosilicates, mixtures of titanium tetrabutoxide with tetraethyl orthosilicate, 9,9-disubstituted fluorenyl compounds, alpha-(1-naphthyl)-omega-trialkoxysilyl alkanes, copolymers of styrene with vinyl naphthalene, methacryloxyalkyl trialkoxysilanes, methacryloxypropyltrimethoxysilanes, glycidoxyalkyl trialkoxysilanes, glycidoxypropyl trimethoxysilanes and combinations thereof, and wherein said composition enables adhesion between said first layer and said second layer of said electroactive device.

A further aspect of the present invention is an electroactive layer with a surface treatment, wherein the surface treatment comprises a composition comprising at least one adhesion promoter material on at least one surface of the electroactive layer, wherein said composition enables adhesion between said layer and at least one other layer in an electroactive device; and wherein the adhesion promoter material comprises at least one compound selected from the group consisting of mixtures of titanium tetraalkoxides with tetraalkylorthosilicates, mixtures of titanium tetrabutoxide with tetraethyl orthosilicate, 9,9-disubstituted fluorenyl compounds, alpha-(1-naphthyl)-omega-trialkoxysilyl alkanes, copolymers of styrene with vinyl naphthalene, methacryloxyalkyl trialkoxysilanes, methacryloxypropyltrimethoxysilanes, glycidoxyalkyl trialkoxysilanes, glycidoxypropyl trimethoxysilanes and combinations thereof.

A further aspect of the present invention is an electroactive device comprising at least one electroactive layer with a surface treatment, wherein the surface treatment comprises a composition comprising at least one adhesion promoter material on at least one surface of the electroactive layer, wherein said composition enables adhesion between said layer and at least one other electroactive layer of said electroactive device; wherein the adhesion promoter material comprises at least one compound selected from the group consisting of mixtures of titanium tetraalkoxides with tetraalkylorthosilicates, mixtures of titanium tetrabutoxide with tetraethyl orthosilicate, 9,9-disubstituted fluorenyl compounds, alpha-(1-naphthyl)-omega-trialkoxysilyl alkanes, copolymers of styrene with vinyl naphthalene, methacryloxyalkyl trialkoxysilanes, methacryloxypropyltrimethoxysilanes, glycidoxyalkyl trialkoxysilanes, glycidoxypropyl trimethoxysilanes and combinations thereof.

Still another aspect of this invention is a method of making an electroactive device comprising (A) an anode layer, (B) a cathode layer, (C) a layer derived from a composition comprising an adhesion promoter and a first electroactive organic material, and (D) at least one other layer comprising an electroactive organic material different from the first electroactive organic material, comprising the steps of: (i) providing a first and a second electrode layer different from each other; (ii) forming a first composite structure comprising (a) the first electrode layer and (b) optionally one or more layers each comprising a different electroactive organic material, (iii) forming a second composite structure comprising (c) the second electrode layer; (d) a layer comprising the intimate mixture of the adhesion promoter material and the first electroactive organic material, and (e) optionally one or more layers each comprising a different electroactive organic material; and (iv) forming the device by laminating the first composite structure and the second composite structure, wherein the layer comprising the adhesion promoter is in contact with and provides adhesion between an electrode layer and at least one other layer of electroactive organic material different from said first electroactive organic material.

Still another aspect of this invention is a method of making an electroactive device comprising (A) an anode layer, (B) a cathode layer, (C) a layer derived from a first electroactive organic material, and (D) at least one other layer comprising an electroactive organic material different from the first electroactive organic material, comprising the steps of: (i) providing a first and a second electrode layer different from each other; (ii) forming a first composite structure comprising (a) the first electrode layer; (b) an adhesion promoter material deposited on one surface of the first electrode layer and (c) optionally one or more layers each comprising a different electroactive organic material, (iii) forming a second composite structure comprising (d) the second electrode layer; and (e) one or more layers each comprising a different electroactive organic material; and (iv) forming the device by laminating the first composite structure and the second composite structure, wherein the adhesion promoter is in contact with and provides adhesion between an electrode layer and a layer of electroactive organic material.

Still another aspect of this invention is a method of making an electroactive device comprising (A) an anode layer, (B) a cathode layer, (C) a layer derived from a first electroactive organic material, and (D) at least one other layer comprising an electroactive organic material different from the first electroactive organic material, comprising the steps of: (i) providing a first and a second electrode layer different from each other; (ii) forming a first composite structure comprising (a) the first electrode layer; (b) one or more layers each comprising a different electroactive organic material, and (c) an adhesion promoter material deposited on at least one surface of at least one electroactive organic layer; (iii) forming a second composite structure comprising (d) the second electrode layer; (e) one or more layers each comprising a different electroactive organic material; and optionally (f) an adhesion promoter material deposited on at least one surface of at least one electroactive organic layer; and (iv) forming the device by laminating the first composite structure and the second composite structure, wherein the adhesion promoter is in contact with and provides adhesion between a first layer comprising a first electroactive organic material and a second layer comprising an electroactive organic material different from said first electroactive organic material Still another aspect of this invention is a 9,9-disubstituted fluorenyl compound of the formula (I):

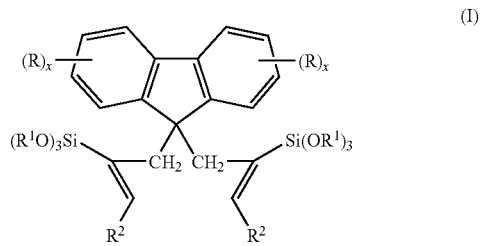

wherein each R is independently alkyl, aryl, halogen, cyano, alkoxide, carboxylate, or hydroxy; each "x" independently has a value of from 0 to the number of positions which can be substituted on the aromatic ring; each $R^1$ is independently a $C_1$-$C_{16}$ alkyl group or an aryl group; each $R^2$ is independently a $C_1$-$C_{16}$ alkyl group; and the geometry about each double bond is independently either cis or trans.

Another aspect of this invention is a 9,9-bis(alkynyl)fluorenyl compound of the formula (IV):

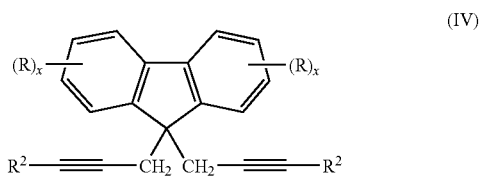

wherein each R is independently alkyl, aryl, halogen, cyano, alkoxide, carboxylate, or hydroxy; each "x" independently has a value of from 0 to the number of positions which can be substituted on the aromatic ring; each R is independently a $C_1$-$C_{16}$ alkyl group.

A further aspect of this invention is a method for preparing a 9,9-disubstituted fluorenyl compound of the formula (I):

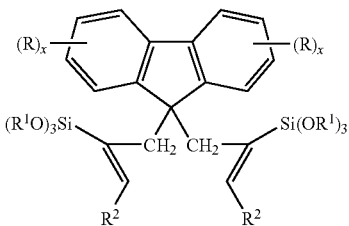

which comprises the steps of:

(i) contacting under reactive conditions a 9,9-unsubstituted fluorenyl compound of the formula (II) in a solvent with base and a substituted alkyne bearing a displaceable group as shown in formula (III):

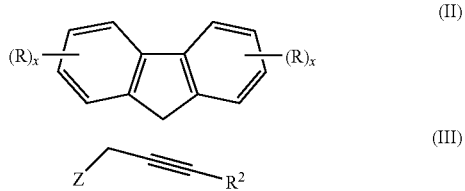

wherein each R is independently alkyl, aryl, halogen, cyano, alkoxide, carboxylate, or hydroxy; each "x" independently has a value of from 0 to the number of positions which can be substituted on the aromatic ring; each $R^2$ is independently a $C_1$-$C_{16}$ alkyl group; and Z is a displaceable group; and (ii) contacting under reactive conditions the product of the reaction of step (i) with a hydrosilylating catalyst and a hydrosilylating agent of the formula $(R^1O)_3$—Si—H, wherein each $R^1$ is independently a $C_1$-$C_{16}$ alkyl group or an aryl group.

Various other features, aspects, and advantages of the present invention will become more apparent with reference to the following description and appended claims.

DETAILED DESCRIPTION OF THE INVENTION

Figure 1:
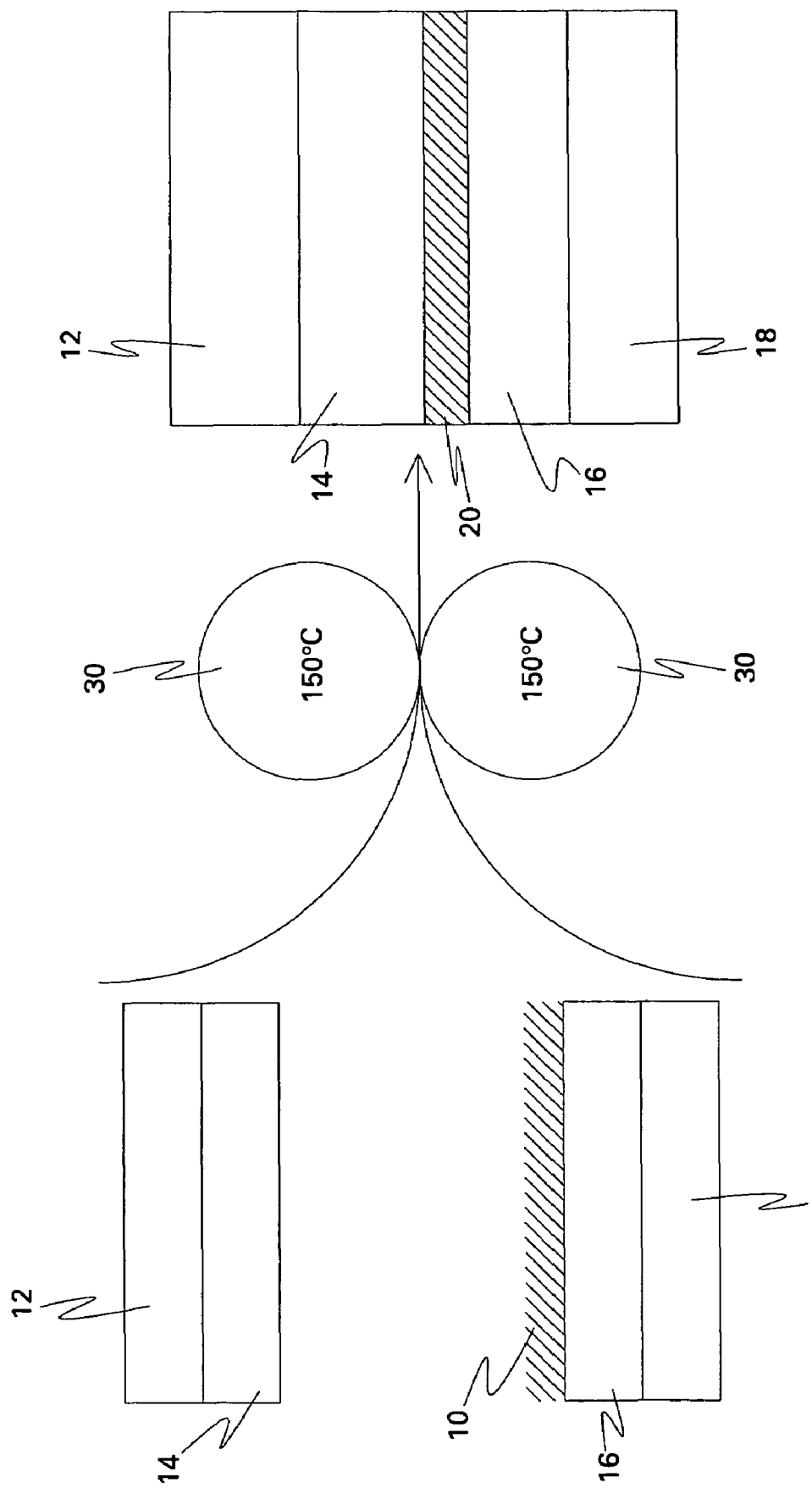
FIG. 1 is a schematic illustration of an embodiment of the present invention showing adhesion promotion between two electroactive organic layers of an electroactive device by surface treatment of at least one layer with adhesion promoter.

In the following specification and the claims which follow, reference will be made to a number of terms which shall be defined to have the following meanings. The singular forms "a", "an" and "the" include plural referents unless the context clearly dictates otherwise. The term "electroactive" as used herein refers to a material that is (1) capable of transporting, blocking or storing charge (either plus charge or minus charge), (2) luminescent, typically although not necessarily fluorescent, and/or (3) useful in photo-induced charge generation. An "electroactive device" is a device comprising an electroactive material. In the present context an electroactive layer is a layer for an electroactive device which comprises at least one electroactive organic material or at least one metal electrode material. As used herein the term "polymer" may refer to either homopolymers derived from essentially a single monomer or to copolymers derived from at least two monomers, or to both homopolymers and copolymers.

The term "alkyl" as used in the various embodiments of the present invention is intended to designate linear alkyl, branched alkyl, aralkyl, cycloalkyl, bicycloalkyl, tricycloalkyl and polycycloalkyl radicals comprising carbon and hydrogen atoms, and optionally containing atoms in addition to carbon and hydrogen, for example atoms selected from Groups 15, 16 and 17 of the Periodic Table. Alkyl groups may be saturated or unsaturated, and may comprise, for example, vinyl or allyl. The term "alkyl" also encompasses that alkyl portion of alkoxide groups. Unless otherwise noted, in various embodiments normal and branched alkyl radicals are those-containing from 1 to about 32 carbon atoms; and comprise as illustrative non-limiting examples $C_1$-$C_{32}$ alkyl (optionally substituted with one or more groups selected from $C_1$-$C_{32}$ alkyl, $C_3$-$C_{15}$ cycloalkyl or aryl); and $C_3$-$C_{15}$ cycloalkyl optionally substituted with one or more groups selected from $C_1$-$C_{32}$ alkyl or aryl. Some illustrative, non-limiting examples comprise methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some particular illustrative non-limiting examples of cycloalkyl and bicycloalkyl radicals comprise cyclobutyl, cyclopentyl, cyclohexyl, methylcyclohexyl, cycloheptyl, bicycloheptyl and adamantyl. In various embodiments aralkyl radicals comprise those containing from 7 to about 14 carbon atoms; these include, but are not limited to, benzyl, phenylbutyl, phenylpropyl, and phenylethyl. The term "aryl" as used in the various embodiments of the present invention is intended to designate substituted or unsubstituted aryl radicals comprising from 6 to 20 ring carbon atoms. Some illustrative non-limiting examples of aryl radicals include $C_6$-$C_{20}$ aryl optionally substituted with one or more groups selected from $C_1$-$C_{32}$ alkyl, $C_3$-$C_{15}$ cycloalkyl, aryl, and functional groups comprising atoms selected from Groups 15, 16 and 17 of the Periodic Table. Some particular illustrative, non-limiting examples of aryl radicals comprise substituted or unsubstituted phenyl, biphenyl, tolyl, xylyl, naphthyl and binaphthyl.

One aspect of this invention is a method for making a first layer in an electroactive device, comprising the steps of (i) preparing a first layer composition by mixing at least one adhesion promoter material and at least one electroactive material; (ii) depositing the composition of the first layer onto a second electroactive layer of said electroactive device to form said first layer, wherein the first layer composition enables adhesion between the first layer and the second layer. In another embodiment an electroactive device further comprises a third layer of electroactive material, said third layer being adjacent to and in contact with the first layer and said first layer being in between the said second layer and said third layer. In a particular embodiment the method optionally further comprises the step of depositing the third layer onto the surface of said first layer opposite the second layer, wherein said first layer composition enables adhesion between said first layer and said second layer or between said first layer and said third layer, or between said first layer and both said second layer and said third layer. The depositing of any layer may optionally be followed by at least one heat treatment step.

Another aspect of this invention is a method for enabling or improving adhesion between two layers of an electroactive device which comprises the step of depositing at least one adhesion promoter material on a surface of at least one electroactive organic layer or metal electrode layer. The method typically comprises the step of depositing a surface treatment composition comprising at least one adhesion promoter material onto at least one surface of at least one electroactive organic layer or onto one surface of at least one metal electrode layer. A second electroactive layer may subsequently be deposited onto said adhesion promoter, such that said adhesion promoter enables adhesion between said second layer and said layer upon which the adhesion promoter has been deposited. In one particular embodiment a surface treatment composition comprising at least one adhesion promoter material is deposited onto one surface of one electroactive organic layer or onto one surface of one metal electrode layer. In another particular embodiment a surface treatment composition comprising at least one adhesion promoter material is deposited onto one surface of at least two electroactive organic layers or onto one surface of one electroactive organic layer and one surface of one metal electrode layer. More than one electroactive layer may be treated with adhesion promoter material, wherein the adhesion promoter material may be the same or different. The depositing of any layer or surface treatment composition may optionally be followed by at least one heat treatment step.

The adhesion promoter material comprises a material such as, but not limited to, a metal compound or a 9,9-disubstituted fluorenyl compound. The metal compound comprises at least one moiety selected from the group consisting of acetoxy, acetylacetonate, acryloxy, alkoxy, amino propyl, carbinol, carboxylate, silanol, siloxy, phosphite, phosphate, glycidoxy, mercaptopropyl, halide, chloride, bromide and oxide; wherein said metal is selected from the group consisting of silicon, tin, zirconium, hafnium, aluminum, antimony and titanium. Illustrative embodiments of metal compounds comprise titanium tetraalkoxide, titanium tetrabutoxide, titanium tetrapropoxide, tetraalkyl orthosilicate, tetraethyl orthosilicate, zirconium tetraalkoxide and like compounds and combinations thereof.

Further examples of adhesion promoters comprise materials such as, but not limited to, alpha-(1-naphthyl)-omega-trialkoxysilyl alkanes. In one aspect of the present invention the adhesion promoter material is a 1-(1-naphthyl)-2-trialkoxysilylethane, illustrative examples of which comprise 1-(1-naphthyl)-2-triethoxysilylethane (NTES), and like compounds. Representative examples of such alpha-(1-naphthyl)-omega-trialkoxysilyl alkanes are described in commonly owned, co-pending application Ser. No. 10/761,696, filed Jan. 20, 2004.

Still further examples of adhesion promoter materials comprise vinyl naphthalene polymers optionally co-polymerized with alkenyl aromatic compounds such as, but not limited to, styrene. In one aspect of the present invention the adhesion promoter is a copolymer of styrene and vinyl naphthalene (NAPHSTYR), wherein the ratio of styrene (x) to vinyl naphthalene (1-x) is x:1-x, wherein x can vary from 0 to about 0.6. Representative examples of such copolymers are described in commonly owned, co-pending application, (GE Docket Number 148981). The weight average molecular weight (Mw) of NAPHSTYR is in one embodiment in a range of between about 8000 and about 75000, in another embodiment in a range of between about 12000 and about 65000, and in still another embodiment in a range of between about 45000 and about 65000. The number average molecular weight (Mn) of NAPHSTYR is in one embodiment in a range of between about 4000 and about 30000, in another embodiment in a range of between about 8000 and about 28000, and in another embodiment in a range of between about 14000 and about 26000. In one particular embodiment the Mw value for NAPHSTYR is in a range of between about 50000 and about 60000, and the Mn value is in a range of between about 18000 and about 24000.

Still further examples of suitable adhesion promoters include materials such as, but not limited to, methacryloxyalkyl trialkoxysilanes, illustrative examples of which include, but are not limited to, methacryloxypropyltrimethoxysilane (MAPTMS), and like compounds. Still further examples of suitable adhesion promoters include materials such as, but not limited to, glycidoxyalkyl trialkoxysilanes, illustrative examples of which include, but are not limited to, 3-glycidoxypropyl trialkoxysilane, and like compounds. In a particular embodiment suitable glycidoxyalkyl trialkoxysilanes comprise 3-glycidoxypropyl trimethoxysilane (GLYMO).

The method of depositing comprises techniques such as spin coating, dip coating, reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic process, langmuir process and flash evaporation, vapor deposition, plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including, but not limited to, reactive sputtering, electron-cyclotron-resonance plasma-enhanced chemical-vapor deposition (ECRPECVD"), inductively coupled plasma-enhanced chemical-vapor deposition ("ICPECVD"), and like techniques, and combinations thereof.

For example in spin coating, depending on spinner parameters, such as, but not limited to, the speed, the percentage of solids in a solution or dispersion comprising an electroactive material or an adhesion promoter or both may vary in order to obtain a desired thickness. The desired thickness in turn may typically be dependent on the chemistry and material properties of one or both of the electroactive material and the adhesion promoter and any other solids present, and may be readily determined by those skilled in the art without undue experimentation. In one particular embodiment the concentration of electroactive material or adhesion promoter or both in a solution or dispersion to be deposited may be in a range of between about 0.01% solids and about 10% solids and in another particular embodiment in a range of between about 0.5% solids and about 3% solids.

A further aspect of this invention is a layer of an electroactive device comprising an intimate mixture of at least one adhesion promoter and at least one electroactive material. In the present context an intimate mixture is one resulting from combination of an adhesion promoter and an electroactive material in solution or dispersion before deposition of said layer. Still a further aspect of this invention is a layer of an electroactive device made by the method which comprises the steps of (i) preparing a first layer composition by mixing at least one adhesion promoter material and at least one electroactive material and (ii) depositing the composition of the first layer onto a second electroactive layer of said electroactive device, wherein the first layer composition enables adhesion between the first layer and the second layer. A further aspect of this invention is an electroactive device comprising a layer comprising an intimate mixture of at least one adhesion promoter and at least one electroactive organic material. Still a further aspect of this invention is an electroactive device comprising a layer made by the method which comprises the steps of (i) preparing a first layer composition by mixing at least one adhesion promoter material and at least one electroactive material and (ii) depositing the composition of the first layer onto a second electroactive layer of said electroactive device, wherein the first layer composition enables adhesion between the first layer and the second layer.

A still further aspect of this invention is a layer of an electroactive device prepared by a method comprising the step of depositing at least one adhesion promoter material onto a surface of an electroactive layer. Still a further aspect of this invention is an electroactive device comprising a layer prepared by the method comprising the step of depositing at least one adhesion promoter material onto a surface of an electroactive layer. The surface thickness of said adhesion promoter in one embodiment is between about 1 nanometer and about 100 nanometers. In a further embodiment of the present invention, the surface thickness of adhesion promoter is between about 1 nanometer and about 10 nanometers.

In some particular embodiments the electroactive layer material of the electroactive device is selected from the group consisting of an electrode material, a light emitting material, a light absorbing material, a charge transport material, a charge injection material, a charge blocking material and combinations thereof. In some particular embodiments; the electroactive device is selected from the group consisting of a light emitting device, an organic light emitting device, a photovoltaic device, a photoconductor, a photodetector, a liquid crystal display, an organic transistor or other molecular electronic device component, and combinations thereof.

In one embodiment of the present invention, the electroactive device typically comprises: (a) an anode; (b) a cathode; and (c) a hole-blocking layer. In another embodiment the electroactive device typically comprises: (a) an anode; (b) a light-emitting layer; (c) a hole-blocking layer; and (d) a cathode. In a further embodiment the electroactive device often comprises: (i) a substrate; (ii) an anode formed over the substrate; (iii) a layer of a conductive polymer or a hole transporter material formed over the anode; (iv) optionally an electron-blocking layer; (v) a layer of light-emitting material; (vi) a layer of a hole-blocking material (vii) a layer of an electron transporter material; and (viii) a cathode formed over the layer of electron transporter material. In a still further embodiment the electroactive device typically comprises: (a) an anode; (b) a cathode; and (c) a layer of light-emitting material. In some other embodiments the electroactive device often comprises: (a) a substrate; (b) an anode formed over the substrate; (c) optionally a layer of a conductive polymer or a hole transporter material formed over the anode; (d) optionally an electron-blocking layer; (f) a layer of light-emitting material (g) optionally a layer comprising a hole-blocking material; (h) optionally a layer comprising an electron transporter material; and (i) a cathode. In one embodiment of the present invention an electroactive device with a light absorbing layer typically comprises: (a) an anode; (b) a cathode and (c) a layer of light-absorbing material. Electroactive devices of the present invention may comprise additional layers such as, but not limited to, one or more of an abrasion resistant layer, a chemically resistant layer, a photoluminescent layer, a radiation-absorbing layer, a radiation reflective layer, a barrier layer, a planarizing layer, and combinations thereof.

Non-limiting examples of light emitting materials comprise poly(N-vinylcarbazole) and its derivatives; polyfluorene and its derivatives such as poly(alkylfluorene), for example poly(9,9-dihexylfluorene), poly(dioctylfluorene) or poly {9,9-bis(3,6-dioxaheptyl)-fluorene-2,7-diyl}; poly (para-phenylene) and its derivatives such as poly(2-decyloxy-1,4-phenylene) or poly(2,5-diheptyl-1,4-phenylene); poly(p-phenylene vinylene) ("PPV") and its derivatives such as dialkoxy-substituted PPV and cyano-substituted PPV; polythiophene and its derivatives such as poly(3-alkylthiophene), poly(4,4'-dialkyl-2,2'-bithiophene), poly(2,5-thienylene vinylene); poly(pyridine vinylene) and its derivatives; polyquinoxaline and its derivatives; and polyquinoline and its derivatives. Mixtures of these polymers, or copolymers based on one or more of these polymers and others may be used to tune the color of emitted light.

Another class of suitable light emitting polymer materials are the polysilanes. Typically, polysilanes are linear silicon-backbone polymers substituted with a variety of alkyl and/or aryl side groups. They are quasi one-dimensional materials with delocalized sigma-conjugated electrons along polymer backbone chains. Examples of polysilanes comprise poly(di-n-butylsilane), poly(di-n-pentylsilane), poly(di-n-hexylsilane), poly(methylphenylsilane), and poly{bis(p-butylphenyl)silane}.

Organic materials having molecular weight less than, for example, about 5000 that are made of a large number of aromatic units are also often applicable as light emitting materials. An example of such materials is 1,3,5-tris{n-(4-diphenylaminophenyl)phenylamino}benzene. An organic light emitting material may also may be prepared from lower molecular weight organic molecules, such as phenylanthracene, tetraarylethene, coumarin, rubrene, tetraphenylbutadiene, anthracene, perylene, coronene, or their derivatives. Other suitable materials are the low molecular-weight metal organic complexes such as aluminum acetylacetonate, gallium acetylacetonate, indium acetylacetonate, aluminum-(picolylmethylketone)-bis{2,6-di(t-butyl)phenoxide}, scandium-(4-methoxy-picolylmethylketone)-bis (acetylacetonate), and mixtures thereof. Other organic emissive materials comprise materials selected from the group consisting of organo-metallic complexes of 8-hydroxyquinoline.

Non-limiting examples of LEP polymer solvents which can be used include aromatics, xylenes, toluene, THF, chlorobenzene, dichlorobenzene, and the like, and combinations thereof.

Non-limiting examples of hole injection enhancement materials are arylene-based compounds such as, but not limited to, 3,4,9,10-perylenetetra-carboxylic dianhydride, bis(1,2,5-thiadiazolo)-p-quinobis(1,3-dithiole), and the like.

Non-limiting examples of hole transport materials comprise triaryldiamine, tetraphenyldiamine, aromatic tertiary amines, hydrazone derivatives, carbazole derivatives, triazole derivatives, imidazole derivatives, oxadiazole derivatives having an amino group, polythiophenes, and the like.

Materials suitable for the electron injection and transport enhancement materials comprise metal organic complexes such as, but not limited to, tris(8-quinolinolato)aluminum, oxadiazole derivatives, perylene derivatives, pyridine derivatives, pyrimidine derivatives, quinoline derivatives, quinoxaline derivatives, diphenylquinone derivatives, nitro-substituted fluorene derivatives, and the like.

Non-limiting examples of hole injection and transport materials comprise organic polymers, such as, but not limited to, poly(3,4-ethylenedioxythiophene) ("PEDOT"), polyaniline, and the like.

Suitable materials for hole blocking layers comprise poly (N-vinyl carbazole), bathocurpoine ("BCP"), bis(2-methyl-8-quinolinato)triphenylsilanolate aluminum (III), bis(2-methyl-8-quinolinato)4-phenolate aluminum (III), bis(2-methyl-8-quinolinato)4-phenylphenolate aluminum (III), and the like.

Suitable cathode layer materials for electroactive devices typically comprise materials having low work function value. Non-limiting examples of cathode materials comprise materials such as, but not limited to K, Li, Na, Mg, Ca, Sr, Ba, Al, Ag, Au, In, Sn, Zn, Zr, Sc, Y, Mn, Pb, elements of the lanthanide series, alloys thereof, particularly Ag—Mg alloy, Al—Li alloy, In—Mg alloy, Al—Ca alloy, and Li—Al alloy, and mixtures thereof. Other examples of cathode materials may comprise alkali metal fluorides, or alkaline earth fluorides, or mixtures of such fluorides. Other cathode materials such as indium tin oxide, tin oxide, indium oxide, zinc oxide, indium zinc oxide, zinc indium tin oxide, antimony oxide, carbon nanotubes, and mixtures thereof are also suitable. Alternatively, the cathode can be made of two layers to enhance electron injection. Illustrative examples include, but are not limited to, an inner layer of either LiF or NaF followed by an outer layer of aluminum or silver, or an inner layer of calcium followed by an outer layer of aluminum or silver.

Suitable anode materials for electroactive devices typically comprise those having a high work function value. Illustrative examples of anode materials include, but are not limited to, indium tin oxide (ITO), tin oxide, indium oxide, zinc oxide, indium zinc oxide, nickel, gold, and mixtures thereof.

In another embodiment the present invention comprises 9,9-disubstituted fluorenyl compounds of the formula (I):

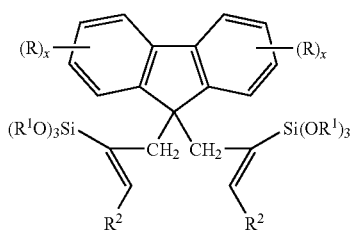

(I)

wherein each R is independently alkyl, aryl, halogen, cyano, alkoxide, carboxylate, hydroxy, or a like substituent; each "x" independently has a value of from 0 to the number of positions which can be substituted on the aromatic ring; each $R^1$ is independently a $C_1$-$C_{16}$ alkyl group or an aryl group; and each $R^2$ is independently a $C_1$-$C_{16}$ alkyl group. It should be noted that although a specific geometry is depicted about the double bonds in formula (I), there is no limitation on the geometry of either of the two double bonds. The geometry about each of the two double bonds may independently be cis or trans. In some particular embodiments x is zero; each $R^1$ is the same and is a $C_1$-$C_{16}$ alkyl group; and each $R^2$ is the same. In other particular embodiments x is zero; each $R^1$ is the same and is selected from the group consisting of methyl, ethyl, and n-propyl; and each $R^2$ is the same and is selected from the group consisting of methyl, ethyl, n-propyl, iso-propyl, n-butyl, sec-butyl, n-pentyl, iso-pentyl, methylpentyl, n-hexyl, and iso-hexyl.

In another embodiment the present invention comprises methods to make 9,9-disubstituted fluorenyl compounds of the formula (I). In one illustrative method a 9,9-unsubstituted fluorenyl compound of the formula (II) is contacted in a first step under reactive conditions in a dipolar aprotic solvent with base and a substituted alkyne bearing a displaceable group as shown in formula (III):

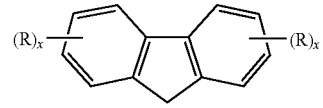

(II)

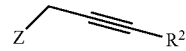

(III)

wherein R, x, and R2 are as previously defined, and Z is a displaceable group. In some embodiments Z is selected from the group consisting of halide, bromide, and chloride. Illustrative dipolar aprotic solvents include, but are not limited to, dimethyl sulfoxide, dimethyl acetamide, and the like. In an illustrative method a 9,9-unsubstituted fluorenyl compound of formula (II) is contacted in a first step under reactive conditions in a non-polar solvent with base, a phase transfer catalyst, and a substituted alkyne bearing a displaceable group as shown in formula (III). Illustrative non-polar solvents include, but are not limited to, toluene, xylene, chlorobenzene, and the like. Reactive conditions comprise effective values for temperature, concentration, time and like variables suitable for providing the desired compound in a desired yield. Any effective base may be used. In some embodiments an effective base comprises an alkali metal hydroxide such as sodium hydroxide, and typically aqueous sodium hydroxide. Any effective phase transfer catalyst may be used. In some embodiments an effective phase transfer catalyst comprises a quaternary ammonium salt such as a tetraalkylammonium halide. The amount of phase transfer catalyst may be readily determined without undue experimentation by those skilled in the art. The amount of both the base and the alkynyl compound (III) is typically at least two equivalents of each in relation to the amount of 9,9-unsubstituted fluorenyl compound.

The product of the first step is a 9,9-bis(alkynyl) fluorenyl compound of the formula (IV):

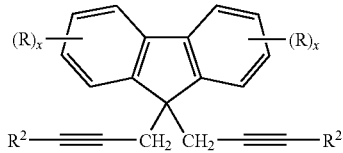

(IV)

wherein R, x, and $R^2$ are as previously defined. The 9,9-bis (alkynyl) fluorenyl compound of the formula (IV) may be isolated from the reaction of step one and purified using any effective method or, if desired, used in crude form with or without isolation.

In a typical second step of the illustrative method the 9,9-bis(alkynyl) fluorenyl compound of the formula (IV) is hydrosilylated with an effective hydrosilylating agent in the presence of an effective hydrosilylating catalyst. Typical effective hydrosilylating agents comprise an —Si—H moiety and in many embodiments have the formula $(R^1O)_3$—Si—H, wherein $R^1$ is as previously defined. Effective hydrosilylating catalysts are well-known in the art and typically comprise a metal of Groups 8, 9, or 10 of the Periodic Table such as platinum. An effective solvent may optionally be used in the hydrosilylation reaction. In a particular embodiment the hydrosilylation reaction is performed in the absence of solvent. The desired 9,9-disubstituted fluorenyl compound of formula (I) may be isolated from the reaction of step two and purified using any effective method or, if desired, used in crude form with or without isolation.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

In the following examples an anode substrate (18) comprised a thin film of conductive indium tin oxide (ITO) on a 0.18 millimeters thick sheet of poly(ethylene terephthalate). A cathode substrate (12) comprised a thin film of aluminum on a 0.18 millimeters thick sheet of poly(ethylene terephthalate).

EXAMPLE 1

This example as illustrated in the embodiment of FIG. 1 demonstrates improvement in adhesion between two electroactive organic layers of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A surface treatment was applied to the PEDOT-PSS layer to improve adhesion to a subsequent layer. In particular, a solution comprising a 9,9-disubstituted fluorenyl compound of the formula (I), wherein x is zero, and both $R^1$ and $R^2$ are ethyl, (about 0.1% solids in p-xylene) was spin coated at a speed of 3000 rpm onto the surface of the PEDOT-PSS layer and the new anode composite and was baked at 110° C. A light emitting polymer (LEP) material (14) comprising American Dye Source 329 (ADS329) was spin coated onto the cathode substrate (12) and was baked at 110° C. The anode composite and cathode composite were overlaid and guided through a roll laminator at 150° C. at a rate of 1 meter per minute as shown in FIG. 1. The assembled device was turned on by applying 7 volts to the anode and cathode parts to obtain a measure of electrical current flow. The brightness and electrical current were measured and compared to a control device that was constructed without PEDOT-PSS surface treatment. The data indicated comparable or enhanced electrical current flow in the device of the invention versus the comparative device. The extent of structural adhesion between the LEP layer and PEDOT-PSS layer was estimated by pulling apart the laminated layers. In comparison to the same set of composite layers laminated without the surface treatment, a 30% increased transfer of the LEP material to the PEDOT-PSS layer was noted indicating that the method of the present invention provides for good structural adhesion.

EXAMPLE 2

Figure 2:
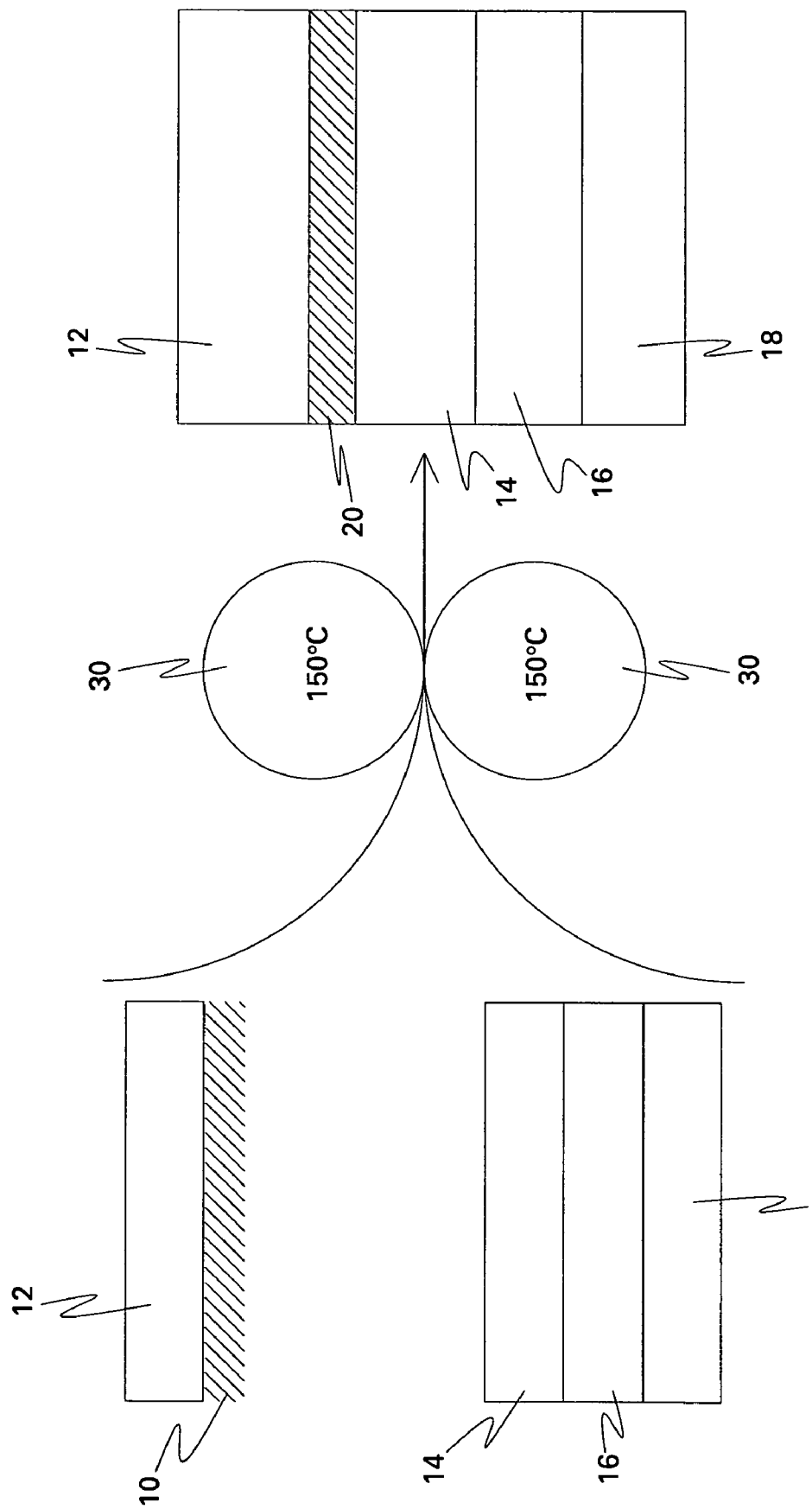
FIG. 2 is a schematic illustration of another embodiment of the present invention showing adhesion promotion between an electroactive organic layer and a metal electrode layer of an electroactive device by surface treatment of at least one layer with adhesion promoter.

This example as illustrated in the embodiment of FIG. 2 demonstrates improvement in adhesion between an electroactive organic layer and a metal layer of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A light emitting polymer (LEP) material (14) comprising American Dye Source 329 (ADS329) was spin coated onto the PEDOT-PSS surface of the anode composite and then the composite was baked again at 110° C. A surface treatment was applied to the cathode surface (12) to improve adhesion to a subsequent layer. In particular, a solution comprising a 9,9-disubstituted fluorenyl compound of the formula (I), wherein x is zero, and both $R^1$ and $R^2$ are ethyl, (about 0.1% solids in p-xylene) was spin coated at a speed of 3000 rpm onto the aluminum surface of the cathode and the new cathode composite was baked at 110° C. The anode composite and cathode composite were overlaid and guided through a roll laminator at 150° C. at a rate of 1 meter per minute as shown in FIG. 2. The assembled device was turned on by applying 7 volts to the anode and cathode parts to obtain a measure of electrical current flow. The brightness and electrical current were measured and compared to a control device that was constructed without cathode surface treatment. The data indicated comparable or enhanced electrical current flow in the device of the invention versus the comparative device. The extent of structural adhesion between the LEP and cathode layer was estimated by pulling apart the laminated layers. In comparison to the same set of composite layers laminated without the surface treatment, a 50% increased transfer of the LEP material to the cathode layer was noted indicating that the method of the present invention provides for good structural adhesion.

EXAMPLE 3

This example demonstrates improvement in adhesion between an electroactive organic layer and a metal layer of an electroactive device by surface-treating at least one of the two layers with adhesion promoter. A surface treatment is applied to a cathode surface to improve adhesion to a subsequent layer. Four different adhesion promoters are examined: (1) a commercially available primer (type SS4155, available from GE Silicones) comprising about 5-10 wt. % titanium tetrabutoxide and about 10-30 wt. % tetraethyl orthosilicate (about 7% solids level in aliphatic hydrocarbon solvent) diluted with isopropanol (1 part SS4155 to 10 parts isopropanol); (2) 17 milligrams (mg) 1:1 titanium tetrapropoxide/tetraethyl orthosilicate in 100 milliliters (ml) isopropanol; (3) 1 part SS4155 diluted with 100 parts isopropanol; and (4) 100 mg 1:1 titanium tetrapropoxide / tetraethyl orthosilicate in 100 ml isopropanol. In separate experiments each adhesion promoter solution is spin coated at a speed of 4000 rpm onto the cathode substrate, and each individual assembly is heated on a hot plate at 100° C. for 10 minutes. In each case an LEP layer comprising American Dye Source 329 (ADS329) is overlaid over the primed cathode surface and the new assembly is guided through a roll laminator at 150° C. at a rate of 1 meter per minute. The contact potential is measured using a Kelvin probe and compared to the contact potential of a control device with cathode substrate not having the surface treatment. In the case of each adhesion promoter, the data indicates comparable or enhanced electrical current flow in the device of the invention versus the comparative device. The extent of structural adhesion between the LEP and cathode layer is estimated by pulling apart the laminated layers. In comparison to the same set of composite layers laminated without the surface treatment, an increased transfer of the LEP material to the cathode layer is noted indicating that the method of the present invention provides for good structural adhesion.

EXAMPLE 4

This example as illustrated in the embodiment of FIG. 2 demonstrates improvement in adhesion between an electroactive organic layer and a metal layer of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A light emitting polymer material (14), comprising American Dye Source 329 (ADS329), was spin coated onto the PEDOT-PSS surface of the anode composite and then the composite was baked again at 110° C. A surface treatment was applied to the cathode surface (12) to improve adhesion to a subsequent layer. In particular, a solution comprising 1-(1-naphthyl)-2-triethoxysilyl-ethane of formula (V) (about 0.1% solids level in p-xylene) was spin coated at a speed of 4000 rpm onto the aluminum surface of the cathode (12) and the new cathode composite was baked at 110° C.

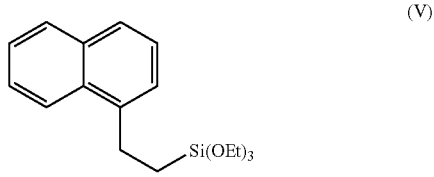

(V)

The anode composite and cathode composite were overlaid and guided through a roll laminator at 150° C. at a rate of 1 meter per minute. The assembled device was turned on by applying 7 volts to the anode and cathode parts to obtain a measure of electrical current flow. The brightness and electrical current were measured and compared to a control device that was constructed without surface treatment. The data indicated comparable or enhanced electrical current flow in the device of the invention versus the comparative device. The extent of structural adhesion between the LEP and cathode layer was estimated by pulling apart the laminated layers. In comparison to the same set of composite layers laminated without the surface treatment, a 20% increased transfer of the LEP material to the cathode surface was noted indicating that the method of the present invention provides for good structural adhesion.

EXAMPLE 5

This example as illustrated in the embodiment of FIG. 2 demonstrates improvement in adhesion between an electroactive organic layer and a metal layer of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A light emitting polymer material (14), comprising American Dye Source 329 (ADS329), was spin coated onto the PEDOT-PSS surface of the anode composite and then the composite was baked again at 110° C. A surface treatment was applied to the cathode surface (12) to improve adhesion to a subsequent layer. In particular, a solution comprising a copolymer derived from styrene and vinyl naphthalene (about 1:1 styrene to vinyl naphthalene with Mw about 56000 and Mn about 22000, employed at about 0.1% solids level in p-xylene) was spin coated at a speed of 4000 rpm onto the aluminum surface of the cathode (12) and the new cathode composite was baked at 110° C. The anode composite and cathode composite were overlaid and guided through a roll laminator at 150° C. at a rate of 1 meter per minute. The assembled device was turned on by applying 7 volts to the anode and cathode parts to obtain a measure of electrical current flow. The brightness and electrical current were measured and compared to a control device that was constructed without surface treatment. The data indicated comparable or enhanced electrical current flow in the device of the invention versus the comparative device. The extent of structural adhesion between the LEP and cathode layer was estimated by pulling apart the laminated layers. In comparison to the same set of composite layers laminated without the surface treatment, a 20% increased transfer of the LEP material to the cathode substrate was noted indicating that the method of the present invention provides for good structural adhesion.

EXAMPLE 6

This example demonstrates improvement in adhesion between an electroactive organic layer and a metal layer of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A surface treatment was applied to a cathode surface (12) to improve adhesion to a subsequent layer. In particular, a solution comprising 3-glycidoxypropyl trimethoxysilane (about 0.1% solids level in p-xylene) was spin coated at a speed of 4000 rpm onto the cathode and was baked at 110° C. The anode composite and cathode substrate were overlaid and guided through a roll laminator at 150° C. at a rate of 1 meter per minute. The assembled device was turned on by applying 7 volts to the anode and cathode parts to obtain a measure of electrical current flow. The brightness and electrical current were measured and compared to a control device that was constructed without surface treatment. The data indicated comparable or enhanced electrical current flow in the device of the invention versus the comparative device. The extent of structural adhesion between the PEDOT and the cathode layer was estimated by pulling apart the laminated layers. In comparison to the same set of composite layers laminated without the surface treatment, a 50% increased transfer of the PEDOT-PSS material to the cathode layer was noted indicating that the method of the present invention provides for good structural adhesion.

EXAMPLE 7

This example demonstrates improvement in adhesion between an electroactive organic layer and a metal layer of an electroactive device by surface-treating at least one of the two layers with adhesion promoter. A hole-transporting layer (16) comprising PEDOT-PSS polymer (2.6% solids in water) was spin coated at 3000 rpm onto the anode substrate (18) and baked at 110° C. A surface treatment was applied to a cathode surface (12) to improve adhesion to a subsequent layer. In particular, a solution comprising methacryloxypropyltrimethoxysilane (about 0.1% solids level in p-xylene) was spin coated at a speed of 4000 rpm onto the cathode and was baked at 110° C. The anode composite and cathode substrate were overlaid and guided through a roll laminator at 150° C. at a rate of 1 meter per minute. The assembled device was turned on by applying 7 volts to the anode and cathode parts to obtain a measure of electrical current flow. The brightness and electrical current were measured and compared to a control device that was constructed without surface treatment. The data indicated comparable or enhanced electrical current flow in the device of the invention versus the comparative device. The extent of structural adhesion between the PEDOT and the cathode layer was estimated by pulling apart the laminated layers. In comparison to the same set of composite layers laminated without the surface treatment, a 50% increased transfer of the PEDOT-PSS material to the cathode substrate was noted indicating that the method of the present invention provides for good structural adhesion.

EXAMPLE 8

Figure 3:
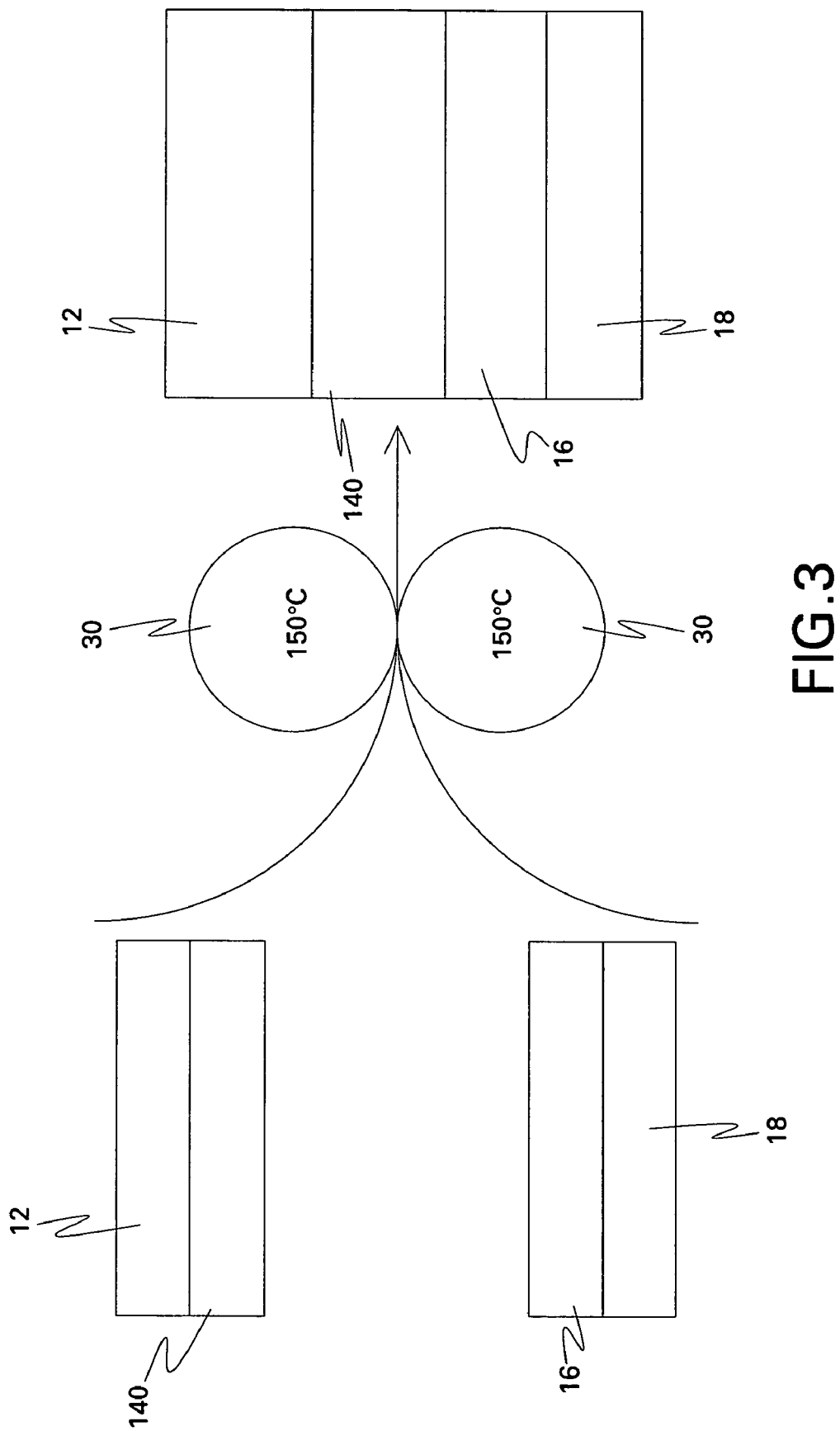
FIG. 3 is a schematic illustration of another embodiment of the present invention showing adhesion promotion between two electroactive organic layers of an electroactive device by co-deposition of adhesion promoter with at least one of the layers.

This example as illustrated in the embodiment of FIG. 3 demonstrates improvement in adhesion between an electroactive organic layer and a metal layer of an electroactive device by co-depositing a mixture of adhesion promoter with the material of at least one of the two layers. A hole-transporting layer (16) comprising PEDOT-PSS polymer (about 2.6% solids in water) is spin coated at 3000 rpm onto the anode substrate (18) and baked at 110° C. A mixture in p-xylene comprising about 1.7% solids of a light emitting polymer (LEP) material (14) comprising American Dye Source 329 (ADS329) and about 0.01-10% solids of an adhesion promoter comprising a 9,9-disubstituted fluorenyl compound of the formula (I), wherein x is zero, and both $R^1$ and $R^2$ are ethyl is spin coated at a speed of 3000 rpm onto the surface of the cathode substrate (12) to form a cathode composite and the cathode composite is baked at 110° C. There is produced a cathode (12) coated with mixed adhesion promoter-LEP layer (140). The anode composite and cathode composite are overlaid and guided through a roll laminator at 150° C. at a rate of 1 meter per minute as shown in FIG. 3. The assembled device is turned on by applying 7 volts to the anode and cathode parts to obtain a measure of electrical current flow. The brightness and electrical current are measured and compared to a control device that is constructed without addition of adhesion promoter. The data indicate comparable or enhanced electrical current flow in the device of the invention versus the comparative device. The extent of structural adhesion between the LEP and cathode layer is estimated by pulling apart the laminated layers. The device of the invention shows improved adhesion between the LEP and cathode layers compared to a control device without adhesion promoter compound.

EXAMPLE 9

Figure 4:
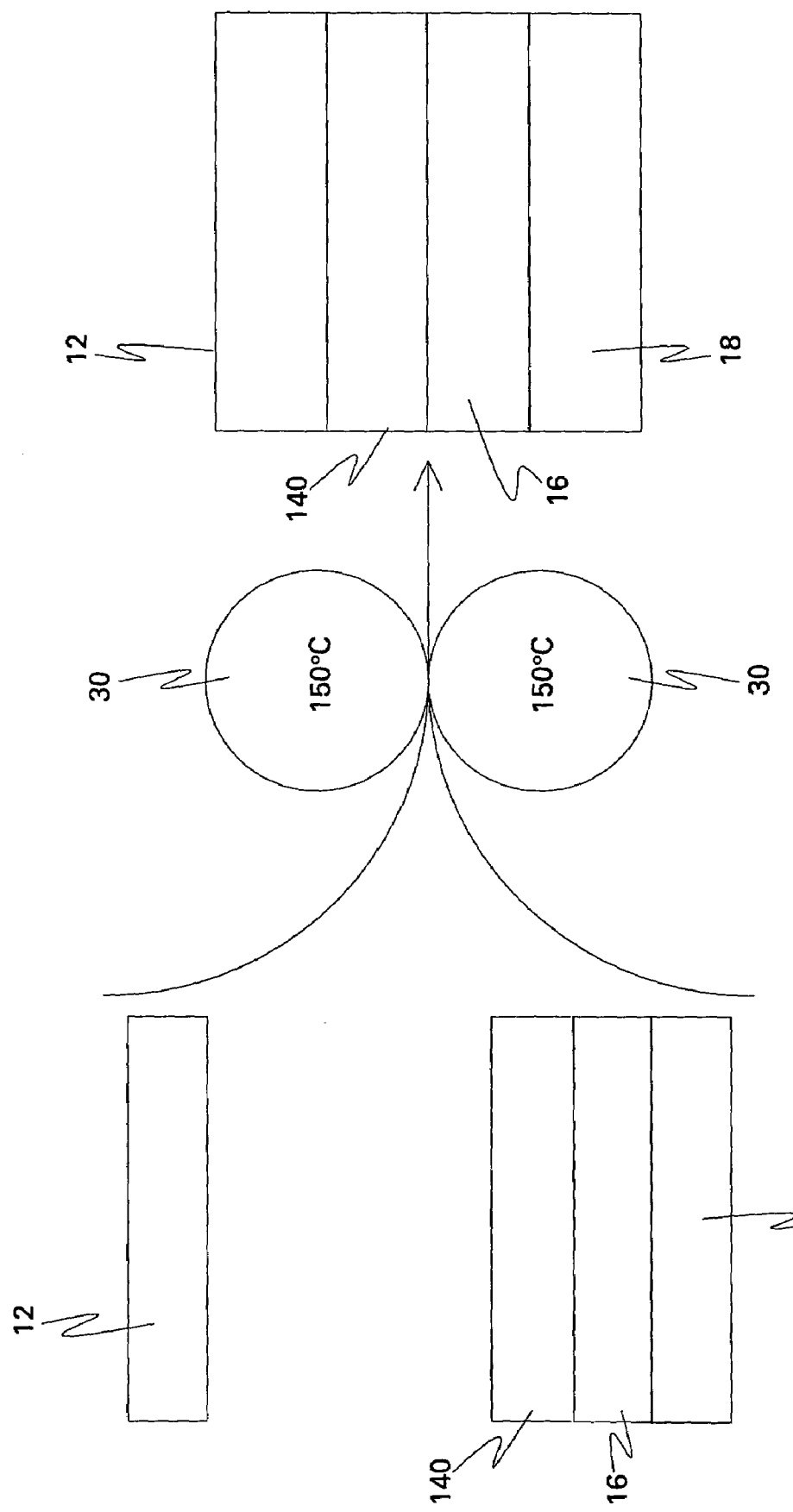
FIG. 4 is a schematic illustration of still another embodiment of the present invention showing adhesion promotion between an electroactive organic layer and a metal electrode layer of an electroactive device by co-deposition of adhesion promoter with the electroactive organic layer.

This example as illustrated in the embodiment of FIG. 4 demonstrates improvement in adhesion between an electroactive organic layer and a metal layer of an electroactive device by co-depositing a mixture of adhesion promoter with the material of at least one of the two layers. A hole-transporting layer (16) comprising PEDOT-PSS polymer (about 2.6% solids in water) is spin coated at 3000 rpm onto the anode substrate (18) and baked at 110° C. to form an anode composite. A mixture in xylene of about 1.7% solids of a light emitting polymer. (LEP) material (14) comprising American Dye Source 329 (ADS329) in xylene and about 0.01-10% solids of an adhesion promoter comprising a 9,9-disubstituted fluorenyl compound of the formula (I), wherein x is zero, and both $R^1$ and $R^2$ are ethyl is spin coated at a speed of 3000 rpm onto the surface of the PEDOT-PSS layer of the anode composite and then the composite is baked again at 110° C. to form the new anode composite. There is produced an anode composite coated with mixed adhesion promoter-LEP layer (140). The anode composite and cathode composite are overlaid and guided through a roll laminator at 150° C. at a rate of 1 meter per minute as shown in FIG. 4. The assembled device is turned on by applying 7 volts to the anode and cathode parts to obtain a measure of electrical current flow. The brightness and electrical current are measured and compared to a control device that is constructed without addition of adhesion promoter. The data indicate comparable or enhanced electrical current flow in the device of the invention versus the comparative device. The extent of structural adhesion between the LEP and cathode layer is estimated by pulling apart the laminated layers. The device of the invention shows improved adhesion between the LEP and cathode layer compared to a control device without adhesion promoter compound.

EXAMPLE 10

Preparation of a 9,9-bis(alkynyl) fluorenyl compound of the formula (IV): Fluorene is contacted under reactive conditions with 1-bromo-2-pentyne and 50% aqueous sodium hydroxide in dimethyl sulfoxide solvent. Characterization by proton magnetic resonance spectroscopy; carbon-13 nuclear magnetic resonance spectroscopy; and mass spectroscopy shows that the desired product is obtained.

EXAMPLE 11

Preparation of a 9,9-bis(alkynyl)fluorenyl compound of the formula (IV): Fluorene is contacted under reactive conditions with 1-bromo-2-pentyne; 50% aqueous sodium hydroxide; and tetrabutylammonium bromide in toluene solvent. Characterization by proton magnetic resonance spectroscopy; carbon-13 nuclear magnetic resonance spectroscopy; and mass spectroscopy shows that the desired product is obtained.

EXAMPLE 12

Preparation of a 9,9-disubstituted fluorenyl compounds of the formula (I): A 9,9-bis(alkynyl)fluorenyl compound of the formula (IV), wherein x is zero and $R^{12}$ is ethyl, is contacted under reactive conditions with excess triethoxysilane and a platinum catalyst in the absence of solvent. Following removal of excess silane, characterization by proton magnetic resonance spectroscopy; carbon-13 nuclear magnetic resonance spectroscopy; and mass spectroscopy shows that the desired product is obtained.

The previously described embodiments of the present invention have many advantages, including, but not limited to, novel compositions and methods for enabling multilayered electroactive devices with improved mechanical stability.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims. All patents, patent applications, and published articles cited herein are incorporated herein by reference.

The invention claimed is:

1. A method for making a first layer in an electroactive device comprising the steps of (i) preparing a first layer composition by mixing at least one adhesion promoter material and at least one organic electroactive material; wherein the adhesion promoter material comprises 9,9-disubstituted fluorenyl compound of formula (1):

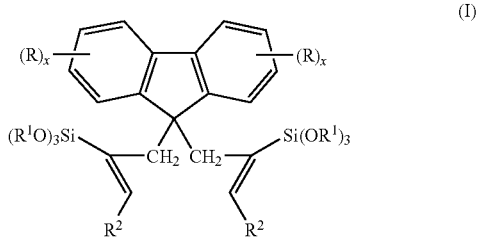

(I)

wherein each R is independently alkyl, aryl, halogen, cyano, alkoxide, carboxylate, or hydroxy; each "x" independently has a value of from 0 to the number of positions which can be substituted on the aromatic ring; each $R^1$ is independently a $C_1$-$C_{16}$ alkyl group or an aryl group; each $R^2$ is independently a $C_1$-$C_{16}$ alkyl group; and the geometry about each double bond is independently either cis or trans, and combination thereof; and (ii) depositing said composition on a second electroactive layer of said electroactive device to form said first layer; and (iii) optionally further depositing a third layer of electroactive material onto the surface of said first layer opposite the second layer, wherein said first layer composition enables adhesion between said first layer and said second layer or between said first layer and said third layer, or between said first layer and both said second layer and said third layer.

2. The method of claim 1, wherein said depositing is selected from the group consisting of reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, spin coating, dip coating, lithographic process, langmuir process and flash evaporation, vapor deposition, plasma-enhanced chemical-vapor deposition, radio-frequency plasma-enhanced chemical-vapor deposition, expanding thermal-plasma chemical-vapor deposition, sputtering, reactive sputtering, electron-cyclotron-resonance plasma-enhanced chemical-vapor deposition, inductively coupled plasma-enhanced chemical-vapor deposition, and combinations thereof.

3. The method of claim 1 wherein the electroactive material is selected from the group consisting of an organic light emitting material, a hole transport material, a hole injection material, a hole blocking material, an electron injection material, an electron transport material and combinations thereof.

4. The method of claim 3 wherein the light emitting material is selected from the group consisting of poly(N-vinylcarbazole), polyfluorene, poly(alkylfluorene), poly(para-phenylene), poly(p-phenylene vinylene), polythiophene, poly (pyridine vinylene), polyquinoxaline, polyquinoline, polysilanes, 1,3,5-tris{n-(4-diphenylaminophenyl) phenylamino}benzene, phenylanthracene, tetraarylethene, coumarin, rubrene, tetraphenylbutadiene, anthracene, perylene, coronene, tris(8-quinolinolato) aluminum; derivatives of the foregoing, 8-hydroxyquinoline aluminum acetylacetonate, gallium acetylacetonate, indium acetylacetonate, aluminum-(picolylmethylketone)-bis{2,6-di(t-butyl)phenoxide}, scandium-(4-methoxy-picolylmethylketone)-bis (acetylacetonate), and combinations thereof.

5. The method of claim 3 wherein the hole injection and hole transport material is selected from the group consisting of poly(3,4-ethylenedioxythiophene), polyaniline, triaryldiamine, tetraphenyldiamine, aromatic tertiary amines, hydrazone derivatives, carbazole derivatives, triazole derivatives, imidazole derivatives, oxadiazole derivatives having an amino group, polythiophenes and combinations thereof.

6. The method of claim 3 wherein the electron injection and hole transport material is selected from the group consisting of tris(8-quinolinolato)aluminum, oxadiazole derivatives, perylene derivatives, pyridine derivatives, pyrimidine derivatives, quinoline derivatives, quinoxaline derivatives, diphenylquinone derivatives, nitro-substituted fluorene derivatives and combinations thereof.

7. The method of claim 3 wherein the hole blocking material is selected from the group consisting of poly(N-vinyl carbazole), bathocurpoine, bis(2-methyl-8-quinolinato) triphenylsilanolate aluminum (III), bis(2-methyl-8-quinolinato)4-phenolate aluminum (III), bis(2-methyl-8-quinolinato)4-phenylphenolate aluminum (III) and combinations thereof.

8. The method of claim 1 wherein x is zero; each $R^1$ is the same and is a $C_1$-$C_{16}$ alkyl group; and each $R^2$ is the same.

9. The method of claim 1 wherein x is zero; each $R^1$ is the same and is selected from the group consisting of methyl, ethyl, and n-propyl; and each $R^2$ is the same and is selected from the group consisting of methyl, ethyl, n-propyl, iso-propyl, n-butyl, sec-butyl, n-pentyl, iso-pentyl, methylpentyl, n-hexyl, and iso-hexyl.

10. A method for improving adhesion between layers in an electroactive device comprising the steps of (i) depositing a surface treatment composition comprising at least one adhesion promoter material on at least one surface of a first electroactive layer, wherein the adhesion promoter material comprises 9,9-disubstituted fluorenyl compound of formula (I):

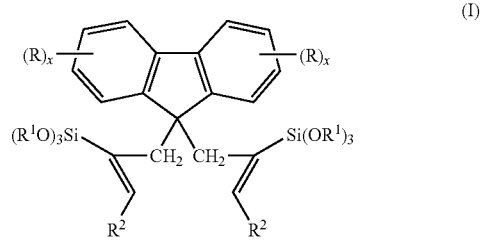

(I)

wherein each R is independently alkyl, aryl, halogen, cyano, alkoxide, carboxylate, or hydroxy: each "x" independently has a value of from 0 to the number of positions which can be substituted on the aromatic ring; each $R^1$ is independently a $C_1$-$C_{16}$ alkyl group or an aryl group; each $R^2$ is independently a $C_1$-$C_{16}$ alkyl group; and the geometry about each double bond is independently either cis or trans, and combination thereof; and (ii) depositing a second electroactive layer onto the surface of said surface treatment composition comprising said adhesion promoter; wherein said composition enables adhesion between said first layer and said second layer of said electroactive device, wherein said first layer is an organic light emitting layer.

11. The method of claim 10, wherein said depositing is selected from the group consisting of reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, spin coating, dip coating, lithographic process, langmuir process and flash evaporation, vapor deposition, plasma-enhanced chemical-vapor deposition, radio-frequency plasma-enhanced chemical-vapor deposition, expanding thermal-plasma chemical-vapor deposition, sputtering, reactive sputtering, electron-cyclotron-resonance plasma-enhanced chemical-vapor deposition, inductively coupled plasma-enhanced chemical-vapor deposition, and combinations thereof.

12. The method of claim 10 wherein the light emitting material is selected from the group consisting of poly(N-vinylcarbazole), polyfluorene, poly(alkylfluorene), poly(para-phenylene), poly(p-phenylene vinylene), polythiophene, poly(pyridine vinylene), polyquinoxaline, polyquinoline, polysilanes, 1,3,5-tris{n-(4-diphenylaminophenyl) phenylamino}benzene, phenylanthracene, tetraarylethene, coumarin, rubrene, tetraphenylbutadiene, anthracene, perylene, coronene, tris(8-quinolinolato) aluminum; derivatives of the foregoing, 8-hydroxyquinoline aluminum acetylacetonate, gallium acetylacetonate, indium acetylacetonate, aluminum-(picolylmethylketone)-bis{2,6-di(t-butyl)phenoxide}, scandium-(4-methoxy-picolylmethylketone)-bis(acetylacetonate), and combinations thereof.

* * * * *

UNITED STATES PATENT AND TRADEMARK OFFICE
CERTIFICATE OF CORRECTION

PATENT NO. : 7,625,596 B2
APPLICATION NO. : 11/013165
DATED : December 1, 2009
INVENTOR(S) : Lewis et al.

It is certified that error appears in the above-identified patent and that said Letters Patent is hereby corrected as shown below:

In Column 4, Line 64, delete "R" and insert -- $R^2$ --, therefor.

In Column 9, Line 36, delete "embodiments;" and insert -- embodiments, --, therefor.

In Column 12, Line 22, delete "R2" and insert -- $R^2$ --, therefor.

In Column 18, Line 50, delete "$R^{12}$" and insert -- $R^2$ --, therefor.

In Column 20, Line 60, in Claim 10, delete "hydroxy:" and insert -- hydroxyl: --, therefor.

Signed and Sealed this

Sixteenth Day of February, 2010

David J. Kappos
*Director of the United States Patent and Trademark Office*